United States Patent [19]

Rose

[11] Patent Number: 5,057,460

[45] Date of Patent: Oct. 15, 1991

[54] METHOD OF MAKING AN ELECTRONIC MODULE, FOR INSERTION INTO AN ELECTRONIC MEMORY-CARD BODY

[75] Inventor: René Rose, Bretonneux, France

[73] Assignee: Schlumberger Industries, Montrouge, France

[21] Appl. No.: 441,587

[22] Filed: Nov. 27, 1989

[30] Foreign Application Priority Data

Nov. 29, 1988 [FR] France .................. 88 15553

[51] Int. Cl.$^5$ .................. H01L 21/56; H01L 21/60; H01L 23/495
[52] U.S. Cl. .................. 437/217; 437/224; 357/70; 357/72; 357/80
[58] Field of Search .................. 264/272.17; 437/209, 437/211, 214, 217, 220, 224; 428/473.5; 29/827, 832, 841, 856, 855, 588, 890; 357/70, 72

[56] References Cited

U.S. PATENT DOCUMENTS

| | | | |
|---|---|---|---|
| 4,152,624 | 5/1979 | Knaebel | 357/72 |
| 4,701,999 | 8/1987 | Palmer | 264/272.17 |

Primary Examiner—Olik Chaudhuri
Assistant Examiner—David E. Graybill
Attorney, Agent, or Firm—Lowe, Price, LeBlanc, Becker & Shur

[57] ABSTRACT

A strip of metal is formed onto a lead-frame defining external contact tabs (24) and electrical connection zones (26), the lead-frame is molded into an injection moded part (39 and 40) which defines a recess (41) for receiving the semiconductor chip of the electronic module, a semiconductor chip (35) is fixed in the recess, the terminals (37) of the chip (35) are electrically connected to the electrical connection zones, and the chip is potted by filling the recess (41) with an insulating material (42).

9 Claims, 4 Drawing Sheets

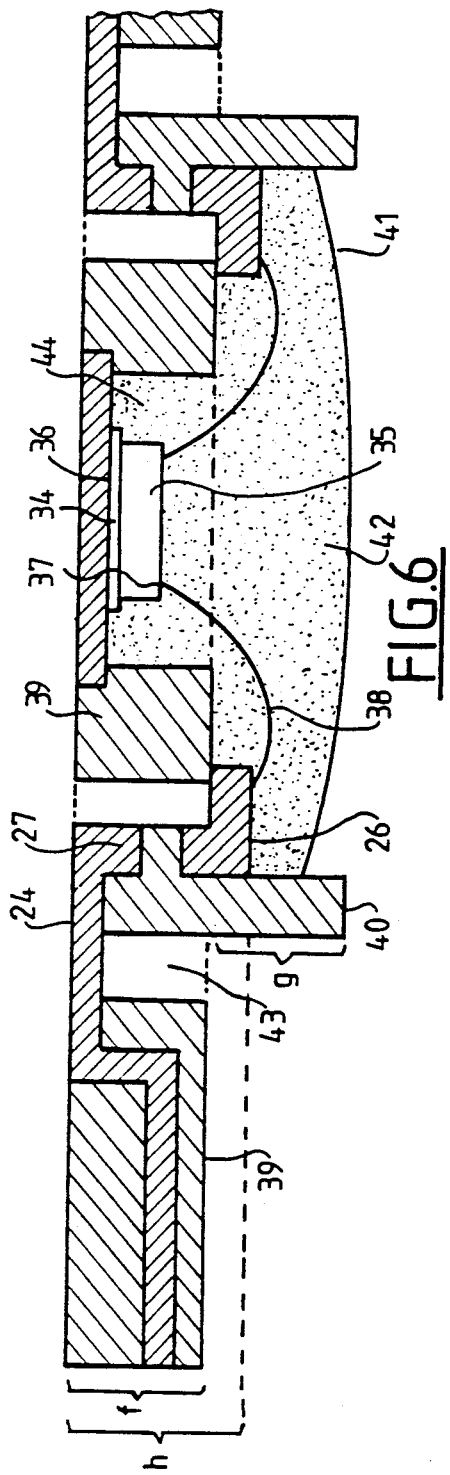
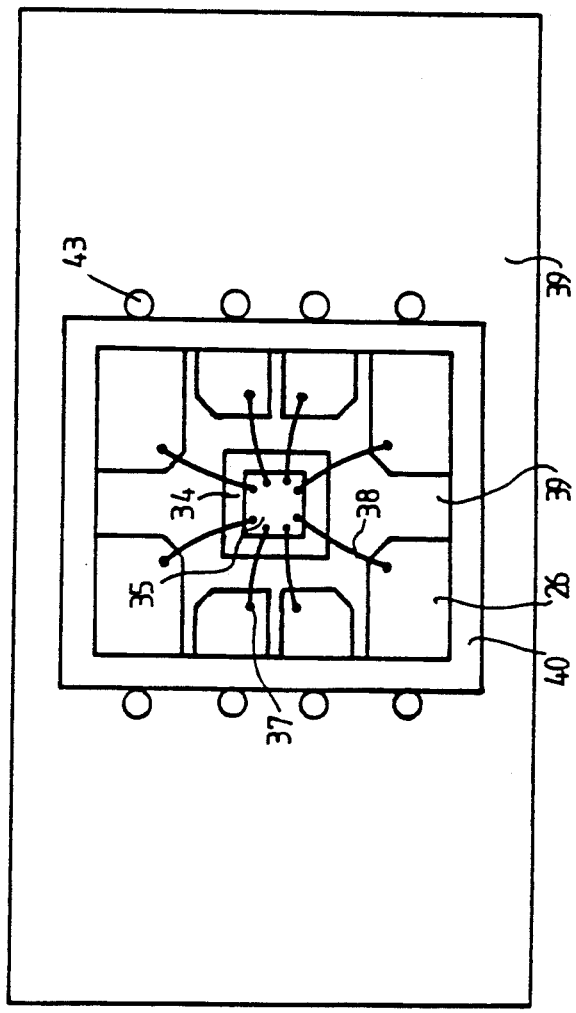

METHOD OF MAKING AN ELECTRONIC MODULE, FOR INSERTION INTO AN ELECTRONIC MEMORY-CARD BODY

The present invention relates to a method of making an electronic module intended to be incorporated in an electronic memory card, and it also provides an electronic module as obtained by implementing the method.

Electronic memory cards enabling their holders to perform various transactions are now well known. The card is essentially constituted by a body of plastic material receiving an electronic module that includes a semiconductor chip, contact tabs for making connection with a card reader, electrical connection zones, and link means for electrically connecting the terminals of the semiconductor chip to the electrical connection zones.

In general, the electronic module is made using a known printed circuit technique. It is also possible to use the lead-frame technique described in the present Applicants' European patent application number 0 254 640. This technique uses a set of electrical conductors or "lead-frame" which is preferably made from a strip of conductive metal material having a thickness of about 0.1 mm, e.g. using a copper-iron alloy. The lead frame is provided with slots for separating the metal conductors from one another, with the various conductors being mechanically interconnected by bridges. After the electronic module has been fixed to the card body, the bridges are cut so as to obtain the desired conductor configuration.

The present invention makes use of the same general technique.

The electronic module thus comprises a set of electrical conductors having a first face and a second face, and a semiconductor chip fixed directly on the second face of the set of conductors. The card body generally has a first face and a second face, and has a first recess formed therein opening out into the first face of the body and serving to receive the set of electrical conductors, and a second recess opening out into the bottom of the first recess for receiving the semiconductor chip. The technique for fixing the electronic module on the card body is also described in European patent application number 0 254 640.

The object of the invention is to provide a method of making an electronic module which uses molding techniques, thereby enabling manufacturing costs to be reduced.

The method of making an electronic module in accordance with the invention comprises the following steps:

a) a set of electrical conductors is provided having a first face and a second face, the set defining both external contact tabs for said card situated on said first face of said assembly, and on said second face of said assembly, electrical connections and a fixing zone for fixing a semiconductor chip;

b) a mold is provided having a cavity which defines the outside shape of said electronic module for incorporating in a memory card, said mold including protection means for preventing molding material being deposited between said protection means and the said external contact tabs, between said protection means and said electrical connection zones, and between said protection means and said zone for fixing a semiconductor chip;

c) said set of electrical conductors is placed in said mold;

d) said molding material is injected into said mold so as to fill said mold cavity;

e) the part obtained in this way is unmolded;

f) said semiconductor chip is fixed on said fixing zone; and g) electrical connections are established between the terminals of said semiconductor chip and said electrical connection zones.

The invention also provides an electronic module for an electronic memory card, the module comprising: a set of electrical conductors, said set having a first face and a second face, the conductors defining external contact tabs for said card being situated in said first face of said set, and electrical connection zones and a fixing zone for fixing a semiconductor chip being included in said second face of said set; a molded part defining a recess for receiving a semiconductor chip; a semiconductor chip fixed on said fixing zone; and link means electrically interconnecting the terminals of said chip to said electrical connection zones.

In a particular embodiment of the electronic module, said molded part comprises both a molded platform situated on the side of said second face of said set, with said electrical connection zones resting on said molded platform, and also a molded barrier situated on the same side as said second face of said set and delimiting said recess in which said semiconductor chip, said molded platform, said electrical connection zones, and said link means for electrically interconnecting said terminals of said chip to said electrical connection zones are all disposed.

The molding technique makes it possible to obtain a molded part having dimensions accurately, as defined in the specifications. This flexibility in use makes it possible to adapt the dimensions of the molding as a function of requirements. The shape of the semiconductor chip, i.e. its dimensional characteristics determine, inter alia, the molding dimensions. When the electronic module is inserted in the card body, the molded part is accurately received in the recesses formed in the card body. The molded barrier prevents the insulating potting material from running, since such running could prevent the electronic module from being inserted in the second recess formed in the card body because of lack of space. It is no longer necessary to machine the electronic module to enable it to be inserted in the card body, and as a result rejects are considerably less numerous, thereby reducing manufacturing costs.

Another advantage of the invention is the reproducibility of the molded parts manufactured. The dimensions of the mold define the dimensions of the molding and thereby enable a manufacturing line for molded parts of specified dimensions to be automated.

Other characteristics and advantages of the invention appear more clearly on reading the following description of various implementations of the invention given by way of non-limiting example. The description refers to the accompanying drawings, in which.

Figure 4A:
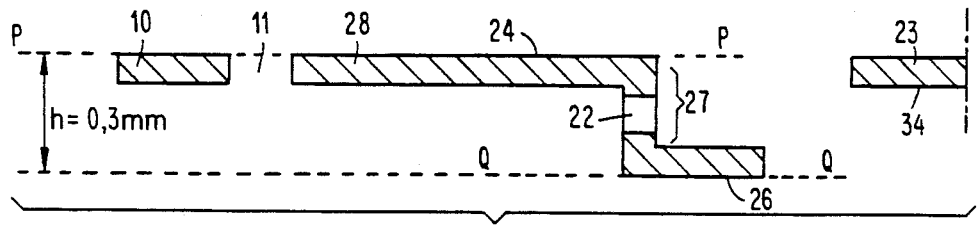
Figure 4B:
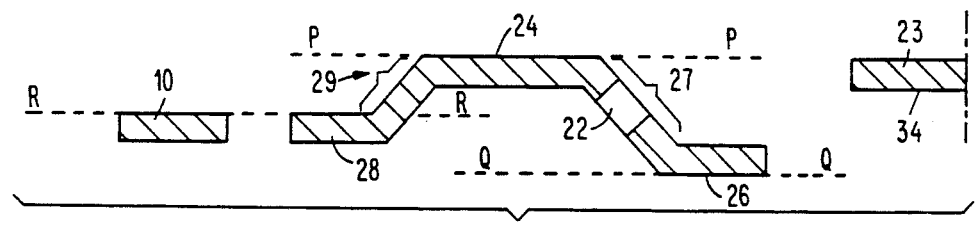
Figure 4C:
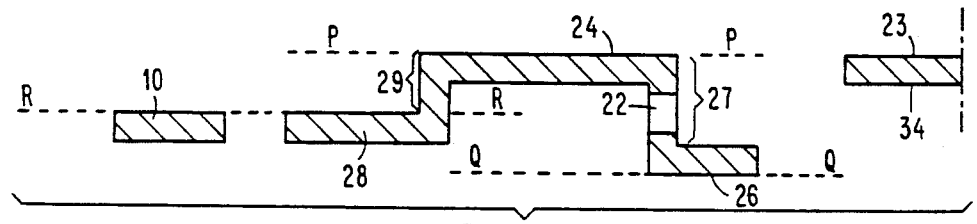
Figure 5:
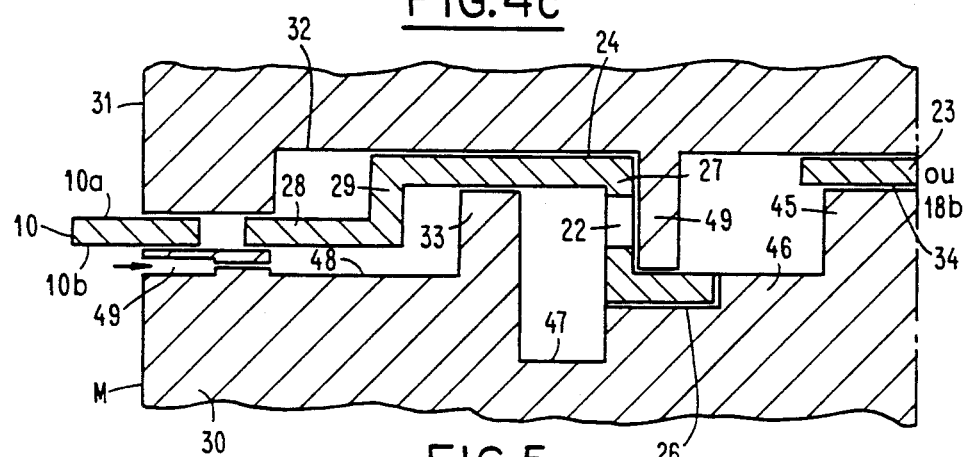

FIGS. 4a, 4b, and 4c are vertical half-sections showing various ways of folding the lead-frame;

FIG. 5 is a vertical half-section through a mold containing the folded lead-frame;

FIG. 6 is a fragmentary vertical section through an overmolded electronic module; and FIG. 7 is a bottom view of the overmolded electronic module shown in FIG. 6.

Figure 3:
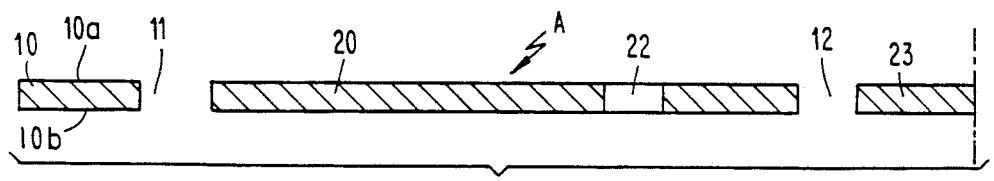
FIG. 3 is a vertical half-section through the lead-frame on plane III—III of FIG. 1.

The vertical half-section views of FIGS. 3, 4, and 5 are symmetrical to the portions omitted from the same figures.

Figure 1:
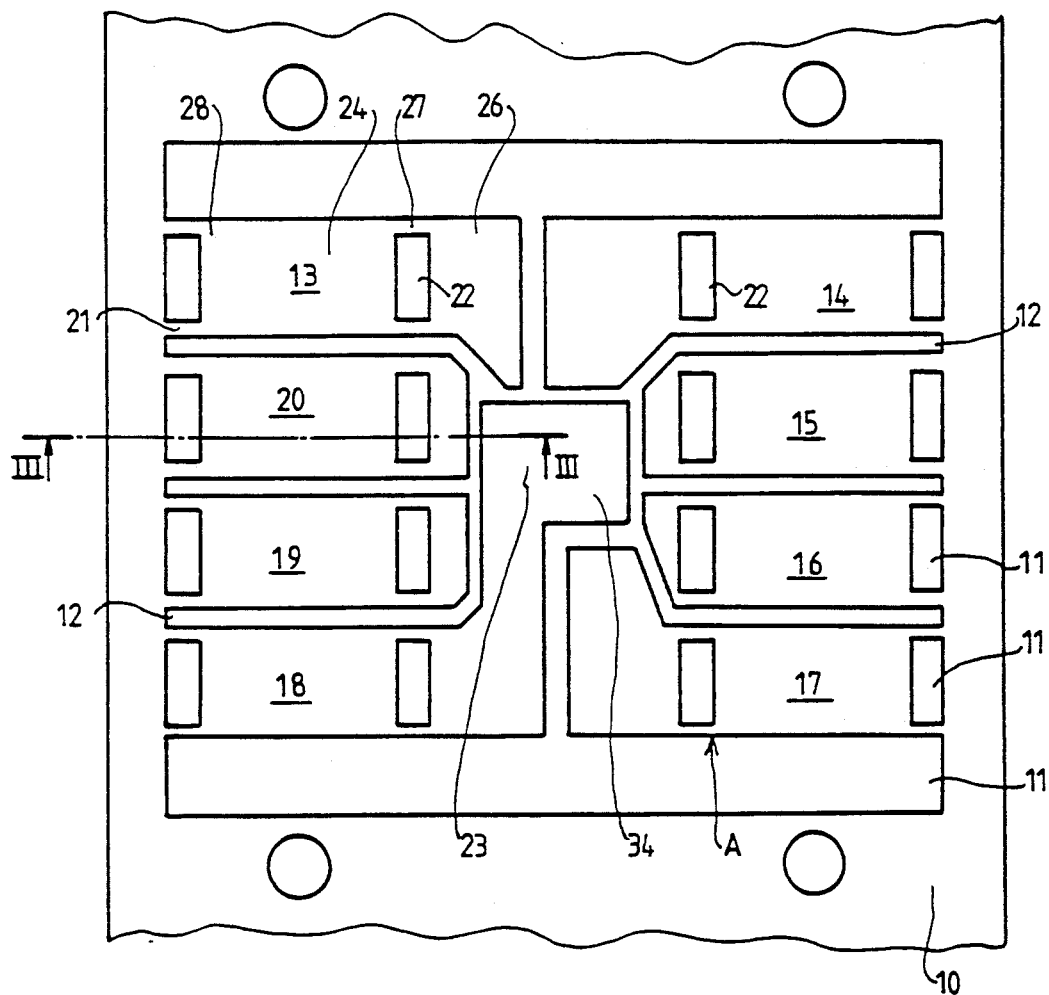
FIGS. 1 and 2 are plan views of a lead-frame.
Figure 2:
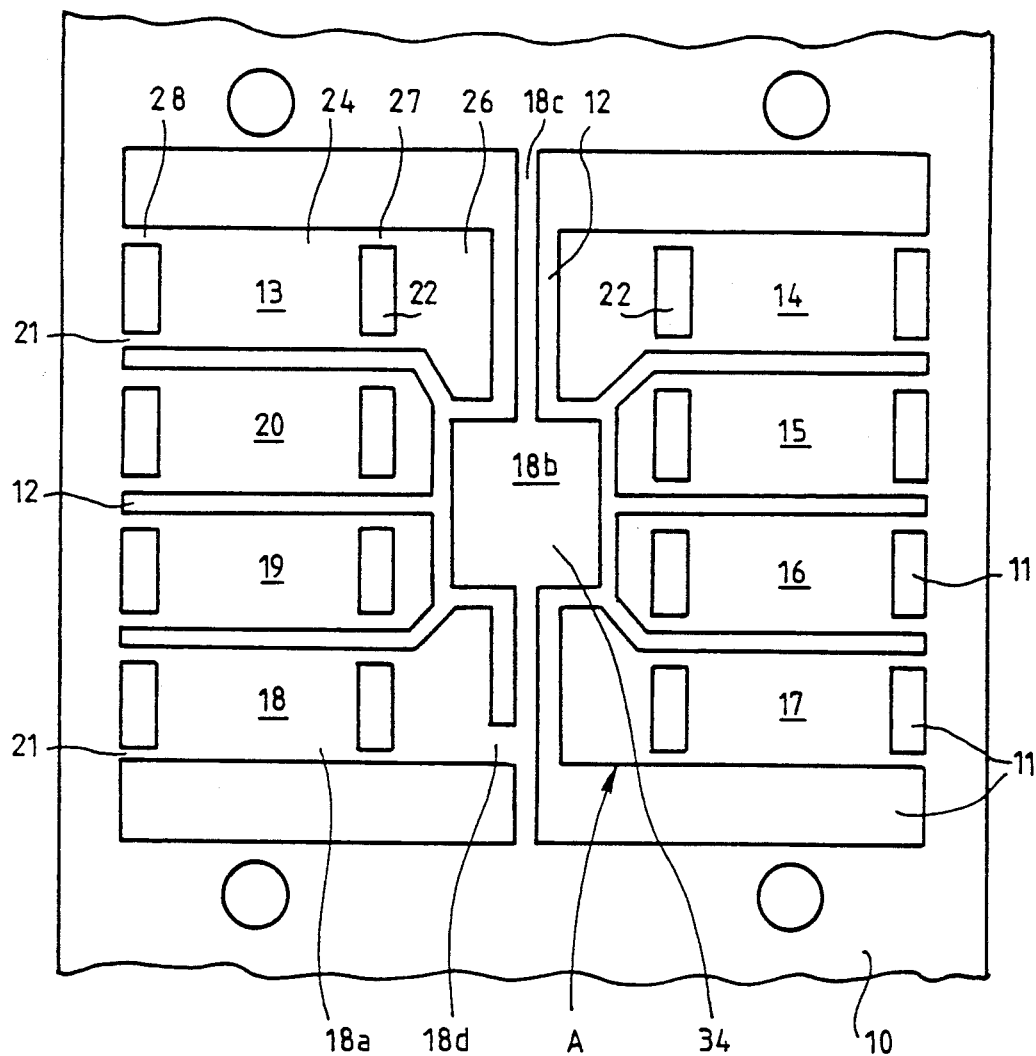

With reference initially to FIGS. 1 and 2, two embodiments of electrical conductor sets, i.e. "lead-frames" are described. The lead-frame is preferably made from a strip of conductive metal material 10 having a top face 10a and a bottom face 10b. A plurality of lead-frames can be made in a single strip, but only one lead-frame referenced A is shown in FIGS. 1 and 2.

The portion of the strip 10 corresponding to the useful portion of the lead-frame is delimited by precut slots such as 11. Within the area delimited in this way, the metal strip 10 is pierced by slots such as 12 which serve to separate the various different conducting zones referenced 13 to 20 from one another. Each conducting zone 13 to 20 comprises, running from its free end to the periphery of the lead-frame A: an electrical connection zone 26, a folding portion 27 including a window 22, an external contact tab 24, and an end portion 28.

In order to ensure mechanical integrity of this set of conductors A, interconnection bridges such as 21 are left in place.

The conducting zone 18 also constitutes the ground contact for the semiconductor chip and it includes a fixing zone 34 for said semiconductor chip situated on the bottom face 10b of the lead-frame A.

In the first embodiment of the lead-frame A shown in FIG. 1, that end 23 of the conducting zone 18 which is situated beyond the connection zone 26 on which the semiconductor chip is to be fixed, is disposed substantially in the middle of the useful portion of the lead-frame A.

In a second embodiment of the lead-frame A as shown in FIG. 2, the conducting zone 18 has a substantially different configuration. It comprises a conducting portion 18a connected to the strip 10 via bridges 21, and a portion 18b on which the semiconductor chip will be fixed and disposed substantially in the middle of the useful portion of the lead frame and connected to the strip 10 via metal passages 18c, with the portions 18a and 18b and the metal passages 18c being interconnected by a bridge 18d.

The advantage of this configuration for the zone 18 as shown in FIG. 2 is explained below.

The portion 18b of the conducting zone 18 shown in FIG. 2 has a function equivalent to that of the end 23 of the conducting zone 18 as shown in FIG. 1 in that the portion 18b and the said end 23 both possess said fixing zone 34 for said semiconductor chip which fixing zone is situated on the bottom face 10b of the lead-frame A.

FIG. 3 is a vertical half-section view through the lead-frame A of FIG. 1 and through the strip 10. The lead-frame A and the strip 10 are subsequently folded by conventional press means in various ways illustrated by FIGS. 4a, 4b, and 4c which are vertical half-section views through the lead-frame A and the strip 10 when folded.

In a first way of folding the strip 10 shown in FIG. 4a, the following are to be found at the same level in a reference plane PP: the strip 10, the end portions 28 of each of the conducting zones 13 to 20, the external contact tabs 24 of each of the conducting zones 13 to 20 for making a contact with a card reader (said external contact tabs being situated on the top face 10A of the lead-frame), and the end 23 or the portion 18b on which the semiconductor chip is to be fixed.

In a secondary plane QQ parallel to the reference plane PP and at a distance of h=0.3 mm to 0.4 mm away therefrom, there are the electrical connection zones 26 of each of the conducting zones 13 to 20 for making electrical connections between the semiconductor chip and the external contact zones 24 situated on the face 10a of the strip 10, said connection zones 26 being situated on the bottom face 10b of the strip 10, with said secondary plane QQ being situated on the same side as said face 10b.

The external contact tabs 24 lying in the reference plane PP and belonging to the conducting zones 13 to 20, and the electrical connection zones 26 lying in the secondary plane QQ and also belonging to the conducting zones 13 to 20 are interconnected by folding portions 27 of the lead-frame, i.e. the portions provided with the windows 22 and extending perpendicularly to the tabs 24 and the connection zones 26. In a second embodiment shown in FIG. 4b, the folding portions 27 may be at an angle other than 90° to the tabs 24 and the connection zones 26, for example they may be at 45°.

In a third embodiment shown in FIG. 4c, the conducting zones 13 to 20 include an additional fold such that the strip 10 and the end portions 28 of the conducting zones 13 to 20 lie in an intermediate plane RR situated between the reference plane PP and the secondary plane QQ. Folds 29 connect the end portions 28 to the external contact tabs 24, with said folds 29 being optionally perpendicular to the end portions 28 and to the external contact zones 24.

The characteristics described above apply to each of the conducting zones 13 to 20. The conducting zone 18 constituting the ground contact has metallic continuity leading to the end 23 or the portion 18b on which the semiconductor chip is fixed in one or other of the embodiments of the lead-frame A. The particular configurations shown in FIG. 2 for the conducting zone 18, and in particular its bridge 18d serve to make the lead-frame A easy to fold since the folding takes place along the axis of the bridge 18d.

After it has been folded in one of the ways shown in FIGS. 4a to 4c, the set of electrical conductors or "lead-frame" A is placed in a mold M whose cavity defines the outside shape of the electronic module. FIG. 5 shows the mold used with the lead-frame being folded as shown in FIG. 4c. The mold comprises a fixed portion 30 and a moving portion 31.

The periphery of the lead-frame A when in place in the mold is clamped between the portions 30 and 31. The cavity in the moving portion 31 has a plane face 32. The cavity in the fixed portion 30 has a more complex shape. It comprises a central core 45, a stepped portion 46 which surrounds the central core 45, a hollow portion 47 which surrounds the stepped portion 46, and a peripheral plane portion 48. The plane face 32 of the moving portion 31 together with the central core 45 and the stepped portion 46 of the fixed portion 30 constitute said means for protecting the mold M. The fixed portion 30 includes an injection nozzle 49. The end 23 or the portion 18b of the conducting zone 18 which includes the fixing zone 34 for said semiconductor chip situated on the bottom face 10b of the lead-frame A, and the external contact tabs 24 of the conducting zones 13 to 20 are all applied against the plane face 32 of the moving portion 31, respectively by the central core 45 and by small-sized studs 33 projecting from the plane peripheral portion 48 of the fixed portion 30 so as to ensure that no molding material can penetrate between the plane face 32 of the moving portion 31 and the external contact tabs 24 or either the end 23 or the portion 18b. The electrical connection zones 26 of the conducting zones 13 to 20, and the fixing zone 34 for the semiconductor chip are pressed respectively against the stepped portion 46 of the cavity in the fixed portion 30 of the mold M by studs 49 projecting from the plane face 32 of the moving portion 31, and against the central core 45 by the plane face 32 of the moving portion 31, thereby ensuring that no molding material can penetrate between the fixing zone 34 for the semiconductor chip and the central core 45, or between the electrical connection zones 26 and the stepped portion 46.

In the following step, the lead-frame A is molded in a three-dimensional configuration as defined by the cavity of the mold M as shown in FIG. 5 by injecting molding material. When the lead-frame is folded as shown in FIGS. 4b or 4c, then the result of the molding is that the end portions 28 of the conducting zones 13 to 20, the folds 29, and the folding portions 27 together with their corresponding windows 22 are completely potted in the molding material, thereby improving the flow of the molding material.

By molding the end portions 28, the folds 29, and the folding portions 27, it is possible to obtain a set A of electrical conductors 13 to 20 which is firmly embedded in the molding material, thereby avoiding problems of adherence between a flat plane of electrical conductors and the molding material. When the lead-frame A is folded in the manner shown in FIG. 4a, the end portions 28 situated in the reference plane PP are pressed against the plane face 32 of the moving portion 31 of the mold M, and the molding material covers only the face 10b of the end portions 28.

The cavity in the moving portion 31 of the mold M may be different in shape, comprising a plane face 32 and a plane peripheral core projecting beyond the plane face 32, with the end portions 28 and the folds 29 shown in FIGS. 4b and 4c being pressed against the peripheral plane core of the moving portions 31 in such a manner as to prevent the molding material from penetrating between the peripheral plane core and either the end portions 28 or the folds 29.

The molding material used is epoxy resin or a material having the same physico-chemical properties, or a substance which is identical to that used for the card body, such as ABS (acrylonitryl-butadiene-styrene). By using such a material, it is possible to obtain an assembled card body and electronic module which is mechanically homogeneous.

In the next step, the part is unmolded. This provides a molded part on the lead-frame A defining a recess 41 in which the fixing zone 34 for the semiconductor chip and the electrical connection zones 26 are visible.

The semiconductor chip 35 is fixed on the fixing zone 34 by means of a conducting glue 36. Electrical connections are established between the terminals 37 of the semiconductor chip 35 and the electrical connection zones 26 by means of conducting wires 38. The molded part comprises a molded platform 39 of thickness f having an opening 44 surrounded by molding material and containing the semiconductor chip and a molded barrier 40 of thickness g obtained by the hollow portion 47 of the fixed portion 30 of the mold M, with the sum of f and g corresponding to the thickness of the electronic module that is to be incorporated in a card body.

The electrical connection zones 26 rest on the molded platform 39 in such a manner that the external contact zones 24 plus the folding portions 27 and the electrical connection zones 26 occupy a depth h lying in the range 0.3 mm to 0.4 mm, which is less than the total thickness f+g of the electrical module. The molded barrier 40 delimits the recess 41 containing the semiconductor chip 35 glued on its fixing zone 34, the molded platform 39 with its opening 44, the electrical connection zones 26 resting on the molded platform 39, and the conductor wires 38 interconnecting the terminals 37 of the semiconductor chip 35 and said electrical connection zones 26. An insulating potting material 42 covers the semiconductor chip 35, the molded platform 39 with its opening 44, the conductor wires 38, and the electrical connection zones 26 inside the recess 41. The molded barrier 40 prevents the insulating potting material 42 from running. FIG. 6 shows the electronic module obtained in this way after separating it from the remainder of the metal strip 10 by cutting the interconnecting bridges 21.

FIG. 7 is an underview of the resulting electronic module prior to depositing the insulating potting material 42.

Once the molded electronic module has been manufactured in this way, it merely needs inserting in a memory card. The fixing technique is the same as that described in European patent application number 0 254 640, and prefixing pegs may penetrate through orifices 43 created by the studs 33 in the fixed portion 30 of the mold M. Another implementation described in French patent application number 2 609 821 would be to mold the card body around the molded electronic module and to use the same molding material for both molding operations so as to obtain an assembly in the form of a single mechanically homogeneous piece.

In a variant embodiment of the electronic module, after the conductor wires have been fixed between the terminals on the chip and the electrical connection zones, the recess is not filled with the insulating potting material. It may suffice to spray a thin layer of electrically insulating material onto the conductor wires. In this case, the heights f and g must be very accurately defined so that the free face of the barrier 40 comes exactly into abutment against the inside face of the recess provided in the card body. Thus, the barrier 40 constitutes a spacer which prevents the bottom of the recess in the card body from being punctured and which thus provides mechanical protection for the chip 35 and the conducting wires 38.

I claim:

1. A method of manufacturing an electronic module for incorporation in an electronic memory card, the method comprising the following steps:
    a) providing a set of electrical conductors having a first face and a second face, the set defining external contact tabs for said card situated on said first face and lying in a reference plane, and electrical connection zones and a fixing zone for fixing a semiconductor chip situated on said second face located on one side of said reference plane;
    b) providing a mold having a cavity which defines the outside shape of said electronic module, said mold including protection means for preventing molding material from being deposited between said protection means and the said external contact tabs, between said protection means and said electrical connection zones, and between said protection means and said fixing zone;

c) placing said set of electrical conductors in said mold;

d) injecting said molding material into said mold so as to fill said mold cavity only on a side of said reference plane which includes said set of electrical conductors;

e) removing said mold;

f) fixing said semiconductor chip on said fixing zone; and g) establishing electrical connections between the terminals of said semiconductor chip and said electrical connection zones.

2. A method according to claim 1, in which said set of electrical conductors is folded prior to being placed in said mold cavity, the folding being such that said electrical connection zones lie in a secondary plane parallel to said reference plane, said secondary plane being situated on the same side of the plane as is said second face of said set, the distance between the two planes being more than the thickness of said conductors.

3. A method according to claim 2, in which said folding of said set of electrical conductors includes folding folding portions of said set, said folding portions interconnecting said external contact tabs situated in said reference plane and said electrical connection zones situated in said secondary plane, said folding portions including windows so as to facilitate the flow of molding material inside the mold.

4. A method according to claim 2, in which said folding of said set of electrical conductors further includes end portions of said electrical conductors situated in an intermediate plane lying between said reference plane and said secondary plane, together with folds interconnecting said end portions to said external contact tabs.

5. A method of manufacturing an electronic module in combination with an electronic memory card; said module including a set of continuous electrical conductors having external contact tabs defined in a first face aligned in a reference plane, electrical connection zones, and a fixing zone defined in a second face aligned in a second plane parallel to said reference plane on one side thereof, and a semiconductor chip; the method comprising the following steps:

placing said set of electrical conductors in a mold, said mold having a cavity defining the outside shape of said module and mold material for defining a recess in said module for receiving said semiconductor chip at said fixing zone;

injecting molding material into said mold to fill said mold cavity to anchor said set of electrical conductors in said molding material, said step of injecting comprising forming said molding material only on said one side of said reference plane;

removing said mold;

fixing said semiconductor chip on said fixing zone; and electrically interconnecting said connection zones to terminals of said semiconductor chip; and forming a card body, for insertion of said electronic module, of material identical to said molding material.

6. The method of manufacturing according to claim 5, wherein the molding material is ABS.

7. The method of manufacturing according to claim 5, including the further step of substantially filling said recess in the module with an insulating potting material.

8. A method of manufacturing an electronic module in combination with an electronic memory card; said module including a set of continuous electrical conductors having external contact tabs, electrical connection zones and a fixing zone, and a semiconductor chip; the method comprising the following steps:

folding said set of electrical conductors in portions to form a first plane including said external contact tabs, a second plane parallel to said first plane on one side thereof, said second plane including said electrical connection zones, and a third plane parallel to and intermediate said first and second planes, said third plane including end portions of said electrical conductors;

placing said set of electrical conductors in a mold, said mold having a cavity defining the outside shape of said module and mold material for defining a recess in said module for receiving said semiconductor chip at said fixing zone;

injecting molding material into said mold to fill said mold cavity, said step of injecting comprising forming said molding material only on said one side of said first plane;

removing said mold;

fixing said semiconductor chip on said fixing zone; and electrically interconnecting said connection zones to terminals of said semiconductor chip;

whereby said portions are anchored in the molding material.

9. A method according to claim 2, wherein said step of injecting further comprises:

forming a molded platform on the side of said second face for placement of said electrical connection zones, and forming a molded barrier to define a recess for disposition of the semiconductor chip, the molded platform and the electrical connection zones.

* * * * *